(12) United States Patent
Pavier et al.

(10) Patent No.: US 7,250,672 B2
(45) Date of Patent: Jul. 31, 2007

(54) DUAL SEMICONDUCTOR DIE PACKAGE WITH REVERSE LEAD FORM

(75) Inventors: Mark Pavier, West Sussex (GB); Ajit Dubhashi, Redondo Beach, CA (US); Jorge Cerezo, Palos Verdes, CA (US); Leigh Cormie, Mountain View, CA (US); Vijay Bolloju, Cerritos, CA (US)

(73) Assignee: International Rectifier Corporation, El Segundo, CA (US)

( * ) Notice: Subject to any disclaimer, the term of this patent is extended or adjusted under 35 U.S.C. 154(b) by 105 days.

(21) Appl. No.: 10/987,697

(22) Filed: Nov. 12, 2004

(65) Prior Publication Data

US 2005/0133902 A1    Jun. 23, 2005

Related U.S. Application Data

(60) Provisional application No. 60/519,586, filed on Nov. 13, 2003.

(51) Int. Cl.
*H01L 23/52* (2006.01)
(52) U.S. Cl. ............... 257/691; 257/676; 257/706; 257/796; 257/E23.042
(58) Field of Classification Search ............ 257/796, 257/706, 676, E23.042, 666, 691, 696, 698, 257/724, 786, 787
See application file for complete search history.

(56) References Cited

U.S. PATENT DOCUMENTS

| | | | |
|---|---|---|---|
| 6,144,093 A * | 11/2000 | Davis et al. | |
| 6,272,015 B1 * | 8/2001 | Mangtani | |
| 6,423,623 B1 * | 7/2002 | Bencuya et al. | |
| 6,432,750 B2 * | 8/2002 | Jeon et al. | |
| 6,521,982 B1 * | 2/2003 | Crowley et al. | |
| 6,710,439 B2 * | 3/2004 | Lee et al. | |
| 6,777,795 B2 * | 8/2004 | Sasakura et al. | 257/686 |
| 2002/0109211 A1 * | 8/2002 | Shinohara | |
| 2002/0171405 A1 * | 11/2002 | Watanabe | |
| 2003/0057530 A1 * | 3/2003 | Karrer | |
| 2003/0075783 A1 * | 4/2003 | Yoshihara | |
| 2003/0183907 A1 * | 10/2003 | Hayashi et al. | |
| 2004/0004272 A1 * | 1/2004 | Luo et al. | |
| 2005/0212101 A1 * | 9/2005 | Funato | |

* cited by examiner

*Primary Examiner*—Zandra V. Smith
*Assistant Examiner*—Tsz Chiu
(74) *Attorney, Agent, or Firm*—Ostrolenk, Faber, Gerb & Soffen, LLP

(57) ABSTRACT

A semiconductor package that includes two semiconductor die each disposed on a respective die pad and a large tracking distance interposed between at least two leads of the package for better creepage characteristics.

22 Claims, 7 Drawing Sheets

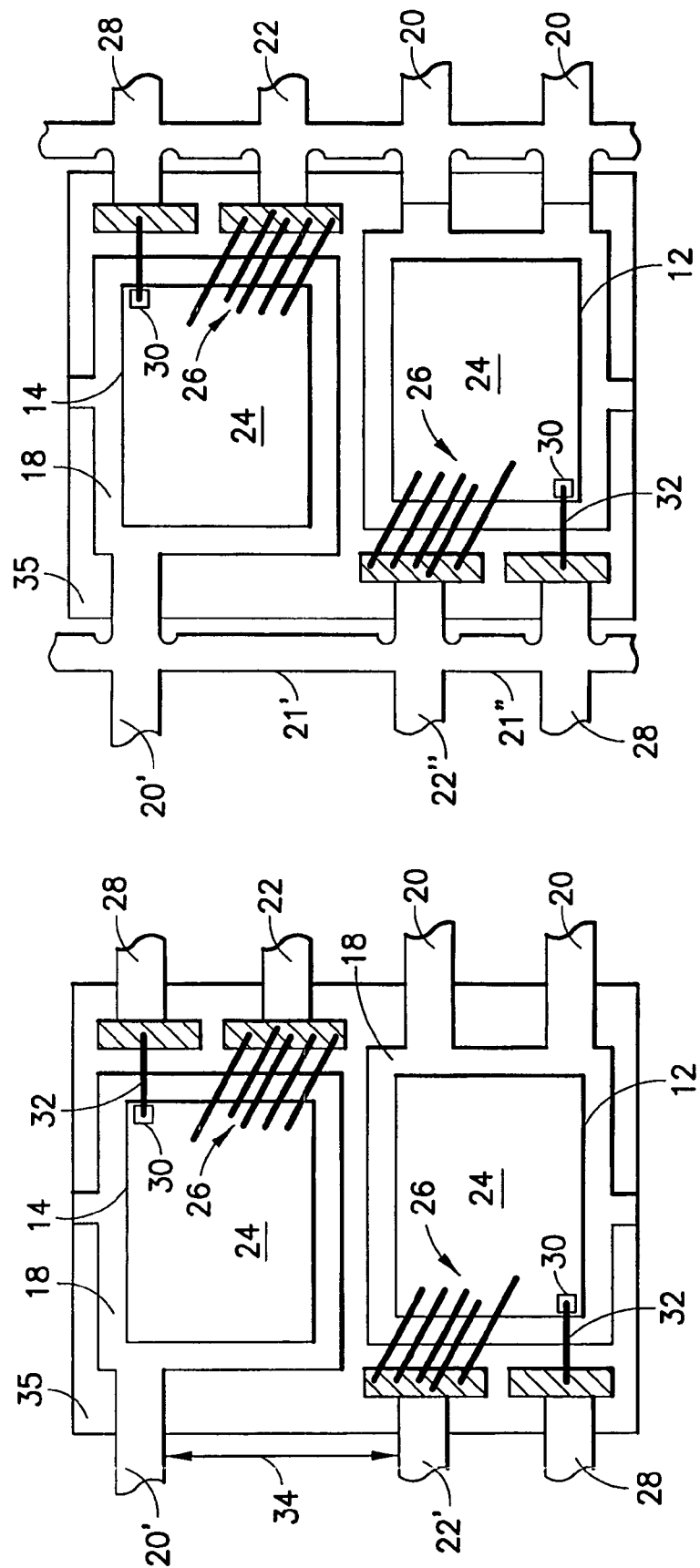

DUAL SEMICONDUCTOR DIE PACKAGE WITH REVERSE LEAD FORM

RELATED APPLICATION

This application is based on and claims the benefit of U.S. Provisional Application No. 60/519,586, filed Nov. 13, 2003, entitled Dual Semiconductor Die Package with Reverse Lead Form to which a claim of priority is hereby made and the disclosure of which is incorporated by reference.

BACKGROUND OF THE INVENTION

Referring to FIG. 1, a half-bridge configuration 10 is routinely incorporated in ballast circuits, audio class D amplifier circuits, synchronous buck circuit, and the like. A half-bridge configuration includes two power semiconductor devices connected in series. FIG. 1 shows a conventional half-bridge arrangement which includes a low side N-channel power MOSFET 12 and a high side N-channel power MOSFET 14. As is conventionally known, the source of high side power MOSFET 14 is electrically connected to the drain of low side power MOSFET 12. Furthermore, the source of low side power MOSFET 12 is connected to the ground GND while the drain of the high side power MOSFET 14 is connected to the power bus $V_+$. The output 13 of the half-bridge is taken from the connection between high side power MOSFET 14 and low side power MOSFET 12.

It is commercially desirable to package high side power MOSFET 14 and low side power MOSFET 12 in a common package to reduce cost and save space. Referring to FIG. 2, it is known to package high side power MOSFET 14 and low side power MOSFET 12 in a common small outline eight lead (SO8) package 16. To accommodate two power MOSFETs 12, 14 and SO8 includes two die pads 18, each having a receiving area for a respective power MOSFET 12, 14. According to a conventional design, each power MOSFET 12, 14 is electrically connected to a respective die pad 18 at its drain side by a conductive adhesive such as solder, conductive epoxy, or the like. Four of the eight leads in an SO8 package are disposed at one side thereof, and the other four at another opposing side thereof. According to a known design, two of the leads, drain leads 20, on each side of the package are electrically connected to the drain of a respective power MOSFET 12, 14 through a die pad 18. Specifically, for example, leads 20 may be integral with a respective die pad 18. In addition, one of the leads, source lead 22, on each side of the package is electrically connected to the source 24 of a respective power MOSFET 12, 14 by wire bonds 26 or the like, while the other lead, gate lead 28 is electrically connected to the gate 30 of a respective power MOSFET 12, 14 by a single wire bond 32. A polymer-based mold compound is usually used to form a molded housing which encapsulates at least the die, the wirebonds, portions of the leads and portions of the die pads. In FIG. 2, the molded housing is removed to better illustrate the components of the package, but the outline of the molded housing 33 is shown by the dotted line surrounding die pads 18.

BRIEF DESCRIPTION OF THE INVENTION

A problem often encountered in package design is creepage. Creepage is the current that may travel on the surface of the molded housing of the package between two leads if the two leads are close enough. Creepage becomes particularly important when leads that are at different potential become closer to one another. As semiconductor die become smaller, it becomes possible to use smaller packages. Such packages have shorter lead distances, which pose a creepage problem when smaller, but higher voltage die are used.

To adapt smaller package outlines to smaller die, a package according to the present invention has one lead removed to increase the tracking distance between leads of high potential difference. Specifically, a drain lead 20 may be removed from a prior art package (see FIG. 2) to increase the tracking distance between source lead 22 and the other drain lead 20.

According to a first embodiment of the present invention, only one drain lead is removed from one side of the package.

According to a second embodiment, a drain lead is removed from each side of the package.

According to another embodiment, the bottom portion of each die pad is exposed for better thermal performance.

According to another aspect of the invention, the leads of the package extend in the same direction faced by the die, thereby improving the thermal characteristics of the package.

The semiconductor devices in a package according to the present invention are not limited to N-channel type power MOSFETs. Rather, P-channel power MOSFETs, IGBTs, power diodes, and non-silicon-based power device such as SiC-based and GaN-based power devices may be used instead of N-channel power MOSFETs without deviating from the scope and the spirit of the present invention.

In addition, a package according to the present invention is not limited to having two identical semiconductor devices. For example, one of the devices may be a power MOSFET and the other a diode.

Moreover, a package according to the present invention need not be limited to use in a half-bridge configuration. The package can be used in other circuit configurations.

Other features and advantages of the present invention will become apparent from the following description of the invention which refers to the accompanying drawings.

BRIEF DESCRIPTION OF THE DRAWINGS

FIG. 3 shows a schematic of a package according to the first embodiment of the present invention.

FIG. 4 shows a schematic of a package according to the first embodiment prior to the removal of the tie bars that connect the leads of the lead frame.

DETAILED DESCRIPTION OF THE FIGURES

Figure 1:
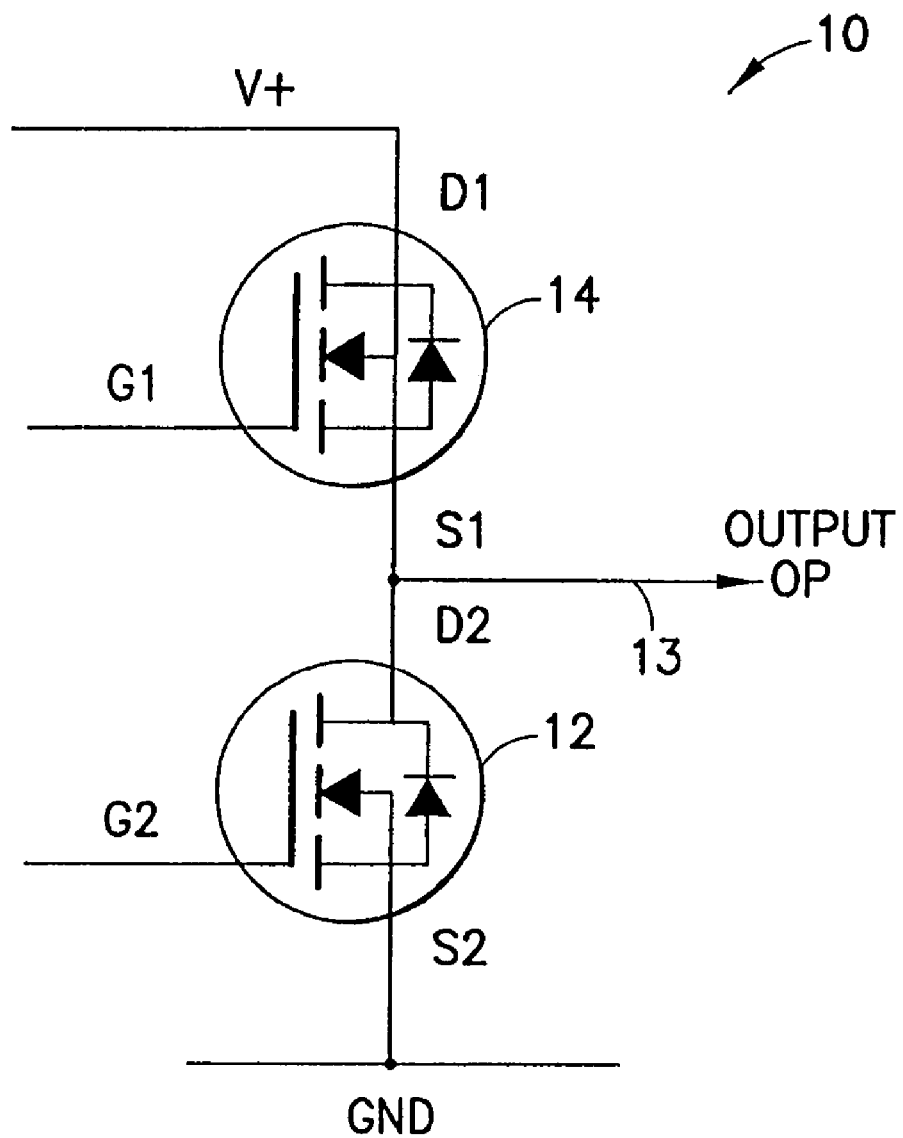
FIG. 1 shows a half-bridge configuration according to the prior art.
Figure 2:
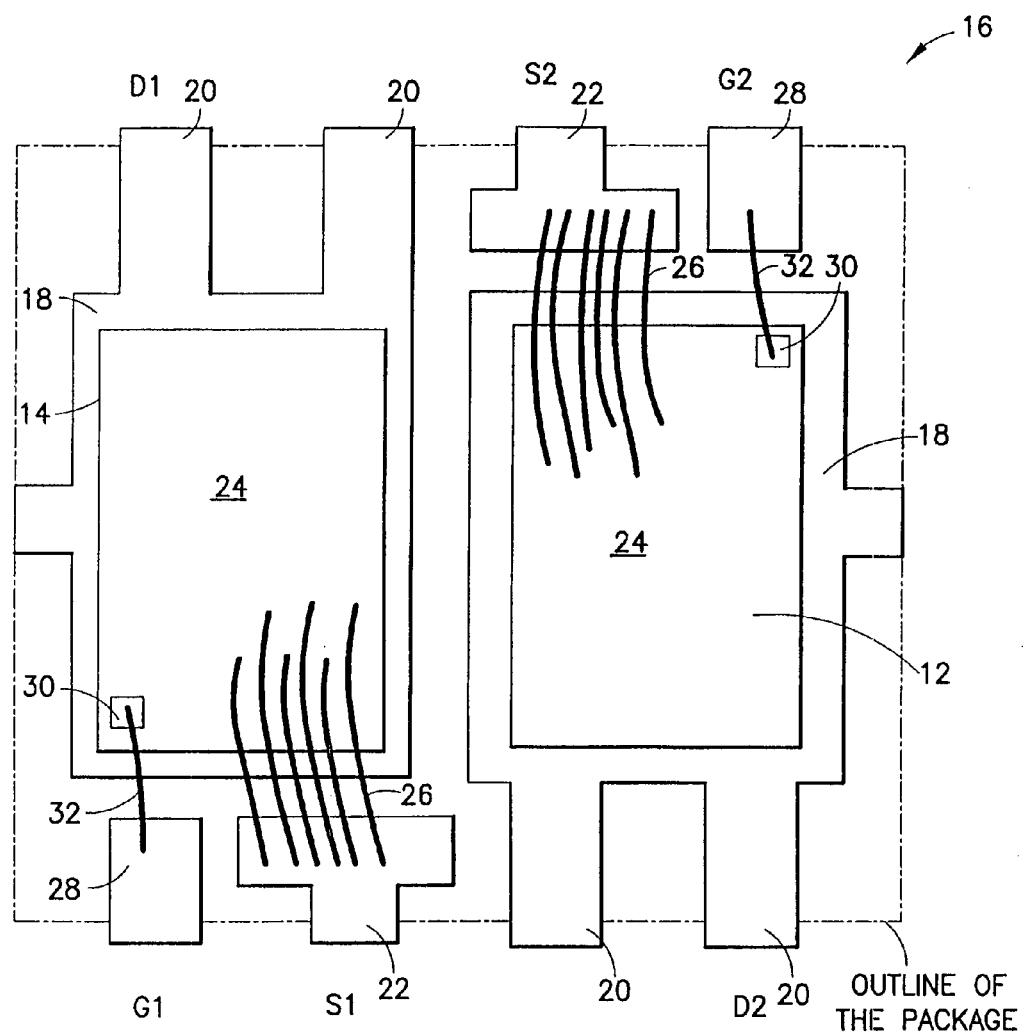
FIG. 2 shows a schematic of a prior art package.

Referring to FIG. 3, in which like numerals identify like elements, a package according to the present invention includes four leads at one side thereof, and three leads at another opposing side thereof. Specifically, one drain lead 20 is eliminated from one side of the package in order to increase tracking distance 34 between at least one drain lead 20' (first power lead) and the next closest lead on the same side, i.e. source lead 22' (second power lead). A gate lead 28 (control lead) is adjacent to the source lead 22'. The increased tracking distance 34, which is made possible by the present invention, allows for the use of a package with a smaller outline but a higher voltage compared to prior art devices of the same outline. Specifically, lead 20' may be used to connect the drain electrode of high side power MOSFET 14 to the power bus and source lead 22' can be used to connect source electrode 24 of low side power semiconductor MOSFET 12 to the ground. It should be noted that to better illustrate the components of the package molded housing 35, which encapsulates the die, the wirebonds and the die pads, is only shown by an outline. A source lead 22 (third power lead). two drain leads 20 (fourth power lead and fifth power lead) and a gate lead 28 (control lead) are located on the other side of the package.

Referring to FIG. 4, according to one aspect of the present invention, one of the drain leads 20 is removed as part of the lead frame design. That is, drain lead 20 is not removed after the lead frame is over molded with mold compound. Rather, the lead frame is designed to be missing one drain lead 20. Thus, as seen in FIG. 4 a tie bar 21' between drain lead 20' and source lead 22" is longer than tie bar 21" between source lead 22" and gate lead 28.

Figure 5:
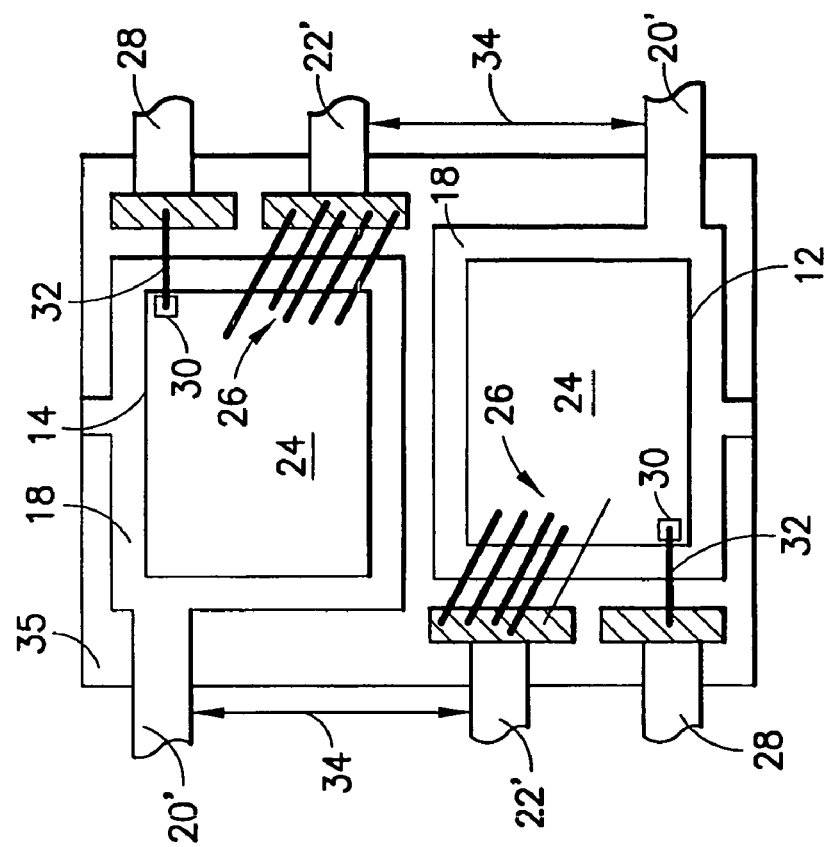
FIG. 5 shows a schematic of a package according to the second embodiment of the present invention.

Referring now to FIG. 5, according to a second embodiment of the present invention, tracking distance 34 between drain leads 20' and source leads 22' is increased on both sides of the package.

Figure 6:
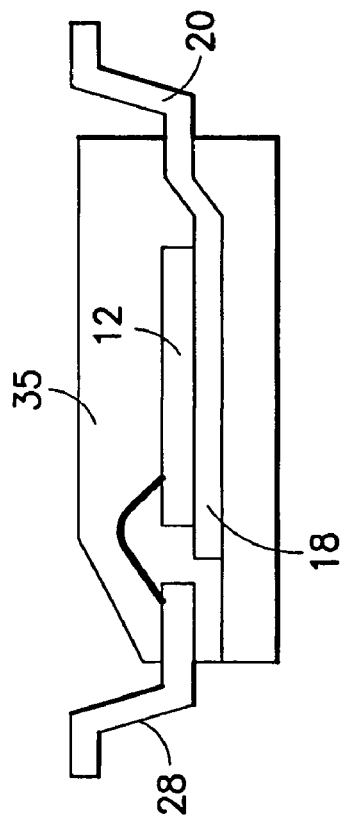
FIG. 6 shows a side plan view of a package according to the present invention.
Figure 7:
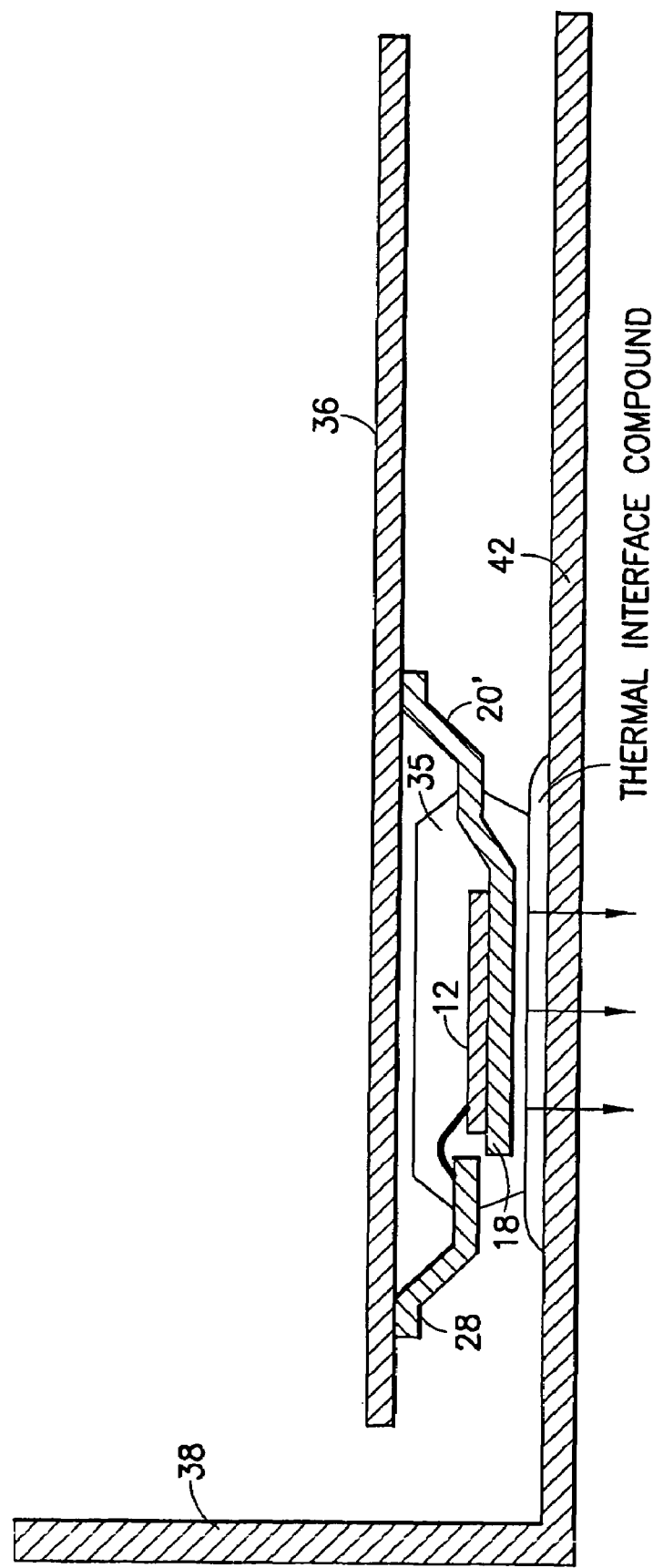
FIG. 7 shows a side plan view of a package according to the present invention as incorporated in an electronic apparatus.

Referring now to FIG. 6, the leads in a package according to the present invention extend in the same direction that is faced by the die receiving surface of die pads 18. Thus, as seen in FIG. 7, a package according to the present invention can be mounted to the underside of a circuit board 36. Furthermore, less mold compound is necessary to cover the die pad surfaces opposite the die receiving surfaces of die pads 18. As a result, the thermal resistance of a package according to the present invention is improved. In addition, a package according to the present invention can form a base for the circuit board 36 to space the same from an external casing or enclosure 38. A thermal interface 42 such as thermal grease or the like between the package and casing 38 can be used to use the casing as a heat spreader or heatsink.

Also, a package according to the present invention can be mounted in a conventional manner on the top surface of a circuit board. An insulation layer can be disposed atop the package and a heatsink can be glued to the insulation layer.

Figure 8:
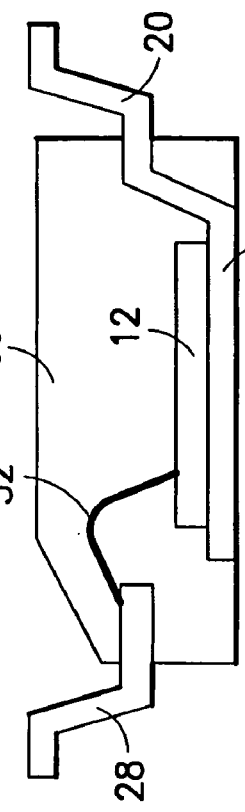
FIG. 8 shows a side plan view of another variation of a package according to the present invention.

Referring now to FIG. 8, mold compound can be removed to expose the free surface of die pads 18 (the surface opposite to the die receiving surface) to further improve the thermal resistance of the package. A package as modified according to FIG. 8, would exhibit better thermal characteristics, particularly in an environment, such as the one shown by FIG. 7, in that heat may be transferred without hindrance from the mold compound.

In a package according to the preferred embodiment of the present invention the lead frame (die pads, and leads) are formed from copper, although other materials can be used without deviating from the present invention. In addition, the mold compound for forming the molded housing can be any known molding polymer, however, a high K polymer is preferred if better thermal performance is desired.

A conventional package can have an Rth J-C through the top of the package of about 160 C/W, when the package has the following characteristics:

15 mils MP8000AN mold compound (0.67 W/mK)
Rth is for 1 die only (e.g. each die will have 160 C./W)
Die size 85×65 mils When a thickness of the mold compound is reduced to about ten mills Rth J-C can be reduced to 110 C/W. Using a high K mold compound can reduce this value by 50 to 75 C/W base on k=11 W/mK.

The semiconductor devices in a package according to the present invention are not limited to N-channel type power MOSFETs. Rather, P-channel power MOSFETs, IGBTs, power diodes, and non-silicon-based power device such as SiC-based and GaN-based power devices may be used instead of N-channel power MOSFETs without deviating from the scope and the spirit of the present invention.

Figure 9:
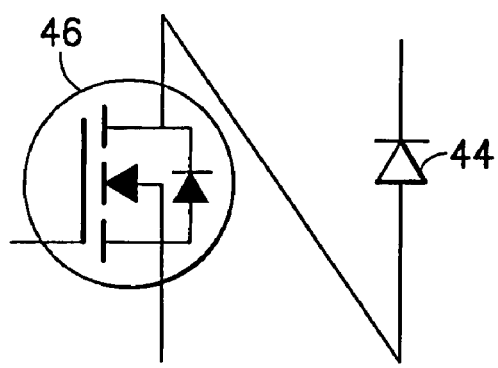
FIGS. 9-11 illustrate alternative embodiments in which diverse semiconductor devices are incorporated in a package according to the present invention.
Figure 10:
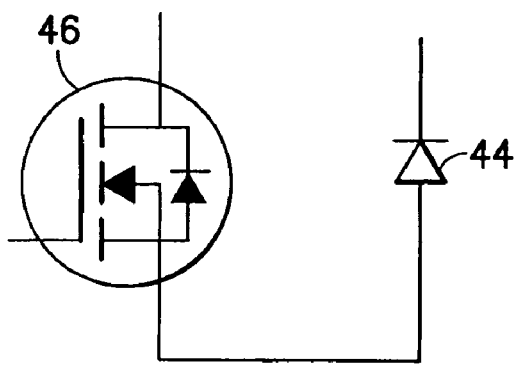
Figure 11:
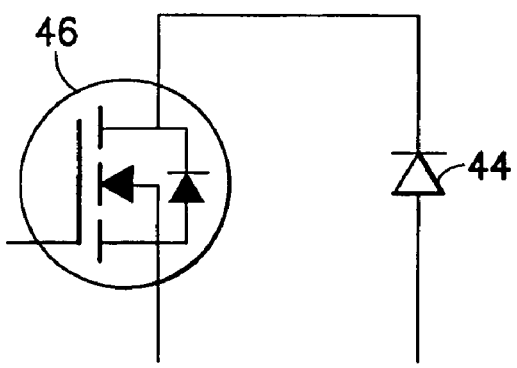

In addition, a package according to the present invention is not limited to having two identical semiconductor devices. Referring to FIGS. 9-11, for example, one of the devices may be a power MOSFET and the other a diode. As seen in FIG. 9, the anode electrode of diode 44 can be electrically connected to the drain electrode of MOSFET 46. Such a configuration may be useful in power factor correction circuits. Also, the anode electrode of diode 44 can be electrically connected to the source electrode of MOSFET 46. Such a configuration may be used in a buck converter circuit. In addition, the cathode electrode of diode 44 may be electrically connected to the drain electrode of MOSFET 46. It should be noted that FIGS. 9-11 only illustrate examples of how a diode 44 and a MOSFET 46 contained within a package according to the present invention can be connected and thus adapted for a specific configuration. The present invention, however, is not limited to the specific subject matter shown by FIGS. 9-11.

Figure 12:
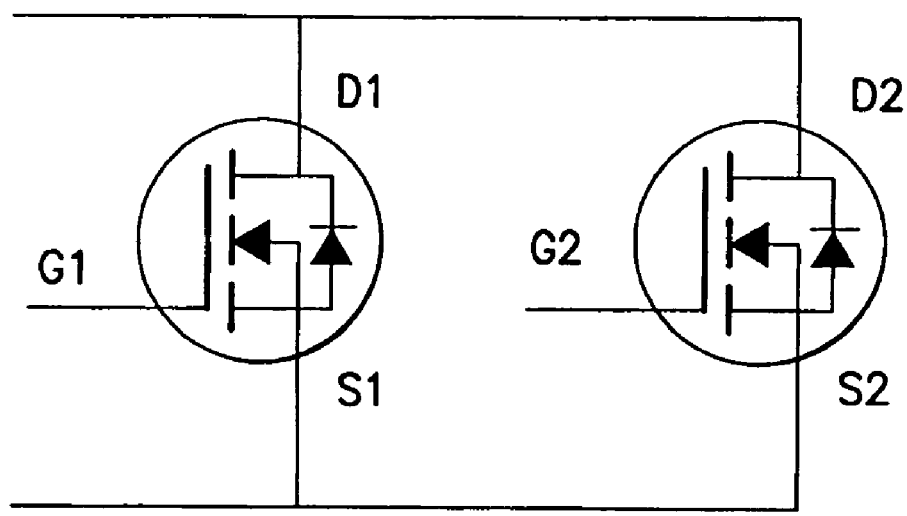
FIGS. 12 and 13 illustrate alternative circuit arrangements for a package according to the present invention that includes two power switching devices.
Figure 13:
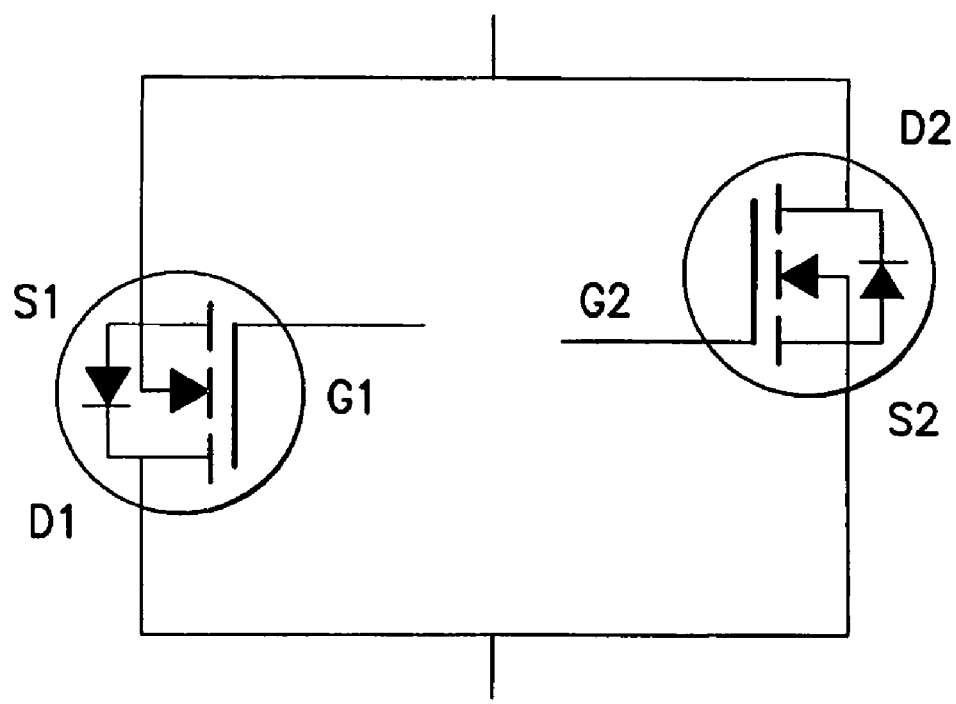

Moreover, a package according to the present invention need not be limited to use in a half-bridge configuration. Referring, for example, to FIG. 12, two power MOSFETs, or IGBTs can be co-packaged in a package according to the present invention and then parallel-connected. Also, referring to FIG. 13, two power MOSFETs or IGBTs can be co-package in a package according to the present invention and then connected to form a bidirectional switch. Specifically, for example, if power MOSFETs are used, the drain electrode of one power switch can be connected to the source electrode of the other, and the drain electrode of the other connected to the source electrode of the one power MOSFET to form a bidirectional switch.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor package comprising:
   a molded housing;
   a lead frame including a first die pad having a die receiving surface, a second die pad having a die receiving surface, a first power lead disposed at one side of said molded housing electrically connected to said first die pad, a second power lead and a control lead at said one side of said molded housing;

a first semiconductor die disposed on said die receiving surface of said first die pad, said first semiconductor die including a first power electrode and a control electrode on a first surface thereof and a second power electrode on a second opposing surface thereof, said second power electrode of said first semiconductor die being electrically connected to said die receiving surface of said first die pad, whereby said second power electrode of said first semiconductor die is electrically connected to said first power lead; and a second semiconductor die disposed on said die receiving surface of said second die pad, said second semiconductor die including a first power electrode and a control electrode on a first surface thereof and a second power electrode on a second opposing surface thereof, said second power electrode of said second semiconductor die being electrically connected to said die receiving surface of said second die pad, said first power electrode of said second semiconductor die being electrically connected to said second power lead and said control electrode of said semiconductor die being electrically connected to said control lead;

wherein a distance without an intervening power lead between said second power lead corresponding to the first semiconductor die and an adjacent said first power lead corresponding to the second semiconductor die, at an outer peripheral side of the package, is larger than a distance between said control lead corresponding to the first semiconductor die and said second power lead corresponding to the first semiconductor die, at the outer peripheral side of the package.

2. A semiconductor package according to claim 1, wherein said first and second semiconductor die are power MOSFETs, IGBTs, or a combination of a power MOSFET and a diode.

3. A semiconductor package according to claim 2, wherein said first power lead is a drain lead electrically connected to the drain electrode of said first power MOSFET, said second power lead is electrically connected to the source electrode of said second power MOSFET, and said control lead is electrically connected to the gate electrode of said second power MOSFET.

4. A semiconductor package according to claim 1, wherein said lead frame is comprised of copper.

5. A semiconductor package according to claim 1, wherein first power contact is electrically connected to said second power lead by a plurality of wirebonds, and said control lead is electrically connected to the said control contact by a wirebond.

6. A semiconductor package according to claim 1, wherein said first power lead is integral with said first die pad.

7. A semiconductor package according to claim 1, further comprising a third power lead and a second control lead each electrically connected respectively to said first power contact and said control contact of said first semiconductor die, and at a fourth power lead electrically connected to said second die pad, said third power lead, said second control lead and said fourth power lead being disposed at a second side of said molded housing opposing said first side.

8. A semiconductor package according to claim 7, wherein said fourth power lead is integral with said second die pad.

9. A semiconductor package according to claim 7, wherein said fourth power lead is spaced without an intervening power lead from said third power leader by a distance that is larger than a distance between said third power lead and said second control lead.

10. A semiconductor package according to claim 7, further comprising a fifth power lead electrically connected to said second die pad, and disposed at said second side of said molded housing.

11. A semiconductor package according to claim 1, wherein said molded housing encapsulates said die pads.

12. A semiconductor package according to claim 1, wherein said die receiving surfaces of said die pads face a first direction and said leads extend toward said first direction.

13. A semiconductor package according to claim 1, wherein said power semiconductor devices are non-silicon-based.

14. A semiconductor package according to claim 13, wherein said non-silicon-based semiconductor device are comprised of either SiC, or GaN.

15. A semiconductor package comprising:

a molded housing;

a first power MOSFET having a drain electrode electrically connected to a first die pad that is electrically connected to a first drain lead, a source electrode electrically connected to a first source lead, and a gate electrode electrically connected to a first gate lead, wherein said first gate lead and said first source lead are disposed at one side of said molded housing, and said first drain lead is disposed at another opposing side of said molded housing; and a second power MOSFET having a drain electrode electrically connected to a second die pad that is electrically connected to a second drain lead, a source electrode electrically connected to a second source lead, and a gate electrode electrically connected to a second gate lead, wherein said second gate lead and said source lead are disposed at said another side of said molded housing, and said second drain lead is disposed at said another opposing side of said molded housing;

wherein said first drain lead corresponding to the second semiconductor die, at an outer peripheral side of the package, is spaced from an adjacent said second source lead corresponding to the first semiconductor die by a distance without an intervening power lead that is greater than a distance between said second source lead and said second gate lead corresponding to the first semiconductor die, at the outer peripheral side of the package.

16. A semiconductor package according to claim 15, wherein said second drain lead is spaced without an intervening power lead from said first source lead by a distance that is greater than a distance between said first source lead and said first gate lead.

17. A semiconductor package according to claim 16, wherein said first source lead is disposed between said first gate lead and said second drain lead.

18. A semiconductor package according to claim 15, wherein said second source lead is disposed between said second gate lead and said first drain lead.

19. A semiconductor package according to claim 15, further comprising another second drain lead adjacent said second drain lead.

20. A semiconductor package according to claim 15, wherein said first drain lead is integral with said first die pad and said second drain lead is integral with said second die pad.

21. A semiconductor package according to claim 15, wherein said die pads are exposed through said molded housing.

22. A semiconductor package according to claim 15, wherein said leads extend in a same direction as a direction faced by said source contacts of said power MOSFETs.

* * * * *